(12) United States Patent
Freytag (10) Patent No.: US 8,729,895 B2
(45) Date of Patent: May 20, 2014

(54) METHOD FOR REGULATING RF SIGNALS IN AN NMR SYSTEM AND PROBE HEAD FOR CARRYING OUT THE METHOD

(75) Inventor: Nicolas Freytag, Binz (CH)

(73) Assignee: Bruker BioSpin AG, Faellanden (CH)

( * ) Notice: Subject to any disclaimer, the term of this patent is extended or adjusted under 35 U.S.C. 154(b) by 678 days.

(21) Appl. No.: 12/926,695

(22) Filed: Dec. 6, 2010

(65) Prior Publication Data

US 2011/0133734 A1 Jun. 9, 2011

(30) Foreign Application Priority Data

Dec. 7, 2009 (DE) .......................... 10 2009 047 565

(51) Int. Cl.
*G01V 3/00* (2006.01)
*G01R 33/44* (2006.01)

(52) U.S. Cl.
USPC ............ 324/307; 324/309; 324/318; 324/322

(58) Field of Classification Search
USPC ........................... 324/300–322; 600/407–464
See application file for complete search history.

(56) References Cited

U.S. PATENT DOCUMENTS

| | | | |
|---|---|---|---|
| 4,739,268 A | 4/1988 | Fox | |
| 5,138,261 A | 8/1992 | Ratzel | |
| 5,288,718 A | 2/1994 | Varga | |
| 6,107,798 A * | 8/2000 | Hoult | 324/318 |
| 7,777,493 B2 * | 8/2010 | Desvaux et al. | 324/322 |
| 2004/0150401 A1 | 8/2004 | Eberler | |
| 2005/0280418 A1 * | 12/2005 | Weiss et al. | 324/322 |

FOREIGN PATENT DOCUMENTS

JP 61118649 6/1986

OTHER PUBLICATIONS

A. Retournard et al., "A versatile secondary transmitter unit for nuclear magnetic resonance spectroscopy", Rev. Soi. Instrum. 61(1), Jan. 1990.

* cited by examiner

*Primary Examiner* — Melissa Koval
*Assistant Examiner* — Emily Chan
(74) *Attorney, Agent, or Firm* — Paul Vincent (57) ABSTRACT

A method for regulating radio frequency (RF) signals in a nuclear magnetic resonance (NMR) system, comprising a spectrometer, a control loop, and an NMR probe head with RF components ($B_E$, $L_E$, $B_K$), wherein the spectrometer comprises a transmitter that transmits RF signals at measuring frequencies with a transmission power ($P_S$), the NMR probe head contains an RF oscillating circuit, and the RF oscillating circuit comprises an RF coil ($L_E$), is characterized in that the control loop controls the duration and/or the phase and/or the power of the transmitted RF signals. Measurement of a parameter is performed by means of the NMR probe head, via which parameter the current in or the voltage across one of the RF components ($B_E$, $L_E$, $B_K$) can be determined, and the transmission powers ($P_S$) and/or the phases and/or the duration of the RF signals are regulated in dependence on the measured parameter. Any occurring losses can thereby be compensated for without reducing the pulse duration.

15 Claims, 6 Drawing Sheets

PRIOR ART

Transmitter power $B_1$ in the sample

Fig. 8a

Transmitter power with preemphasis $B_1$ in the sample with preemphasis

PRIOR ART

METHOD FOR REGULATING RF SIGNALS IN AN NMR SYSTEM AND PROBE HEAD FOR CARRYING OUT THE METHOD

This application claims Paris Convention priority of DE 10 2009 047 565.6 filed Dec. 7, 2009 the complete disclosure of which is hereby incorporated by reference.

BACKGROUND OF THE INVENTION

The invention concerns a method for regulating radio frequency (RF) signals in a nuclear magnetic resonance (NMR) system, comprising a spectrometer, a control loop, and an NMR probe head with RF components, wherein the spectrometer comprises a transmitter which transmits RF signals at measuring frequencies and with a transmission power. The NMR probe head comprises at least one RF oscillating circuit which is tuned, by means of RF components, to the resonance frequency of a type of nucleus to be investigated, wherein the RF oscillating circuit comprises at least one RF coil which is disposed around a measuring sample and, by transmitting RF signals, is used to excite nuclear spins in a sample and to receive NMR signals resulting from this excitation, wherein the NMR probe head may contain further RF components which may be components of the RF oscillating circuit, of the coupling and the filter networks.

In NMR spectrometer systems, radio frequency pulses are irradiated onto a measuring sample by means of a transmitting coil or a transmitting/receiving coil, and the time-resolved response from the measuring sample is detected. The magnetic field component of the RF fields ("magnetic field") thereby couples with the spin system. In many cases, several measuring frequencies are also connected to one single transmitting/receiving coil by means of a tuning network. In addition to the use of coils having one or several windings, which may be designed in the form of saddle coils or solenoid coils, the use of resonator structures such as Birdcage or Alderman-Grant resonators is also possible. Other types of resonators, such as e.g. coaxial or transmission-line resonators, are used less frequently. The term "coil" below means any form of transmitting or transmitting/receiving structure which is used to generate an RF field in a measuring sample.

With a defined magnetic field, i.e. a defined amplitude of the current in the coil and defined transmission frequency $f_0$, the excitation pulses have a characteristic duration (pulse duration $p_1$) in order to rotate the nuclear spin magnetization of a certain type of nucleus with a resonance frequency $f_S=f_0$ through 90°. The pulse durations associated with further pulse angles can generally be easily calculated from this 90° pulse duration. When the transmission frequency $f_0$ of the RF pulses differs from the resonance frequency $f_S$ of the spins, the pulse angle will not be 90° for a given current amplitude. The excitation width of an RF pulse is generally inversely proportional to its pulse duration.

A current pulse must be generated in the coil to generate the radio frequency magnetic field in the measuring sample. The coil is generally connected to form an oscillating circuit using capacitors and/or a tuning network, and is tuned to the resonance frequency of the nuclear spins. This oscillating circuit is connected to a transmitter by means of a coupling network via transmission lines with defined impedance (normally 50Ω). The coupling network is used to adjust the impedance of the oscillating circuit to the impedance of the transmission line. With optimum adjustment, a wave is transmitted without reflections. In case of mismatch, part of the wave is reflected at the coupling network. Such reflections occur at all impedance breaks. For this reason, it is important to adjust the oscillating circuits to the different measuring frequencies of one measuring head and adjust the impedances to the transmission lines. With perfect adjustment in the stationary limiting case, the overall transmitted power is transferred to the oscillating circuit and dissipated there.

The impedance of an oscillating circuit at resonance is inversely proportional to its Q-value (with fixed inductance of the coil). However, when lossy measuring samples are used, the Q-value of an NMR detection system decreases due to the additional losses in the measuring sample. For this reason, the impedance transformation must be adjusted. This adjustment is called "matching". Furthermore, the resonance frequency of an oscillating circuit changes due to the electric field components which penetrate through the measuring sample. It must be readjusted to the transmission frequency after change of a measuring sample in order to prevent reflections and ensure optimum reception sensitivity. This process is called "tuning".

The current in the oscillating circuit will decrease by increasing the loss resistance/reducing the Q-value upon insertion of a lossy measuring sample into the measuring head for a given transferred power. The generated radio frequency magnetic field has a smaller amplitude and in order to obtain the same flip angle of the nuclear spins, either the duration of the pulses must be extended or the transmission power must be increased.

In NMR spectrometers according to prior art, the pulse duration is adjusted in order to compensate for the additional losses. When lossy measuring samples are used, this extension of the excitation pulses reduces the excitation bandwidth compared to measuring samples without loss.

Figure 10:
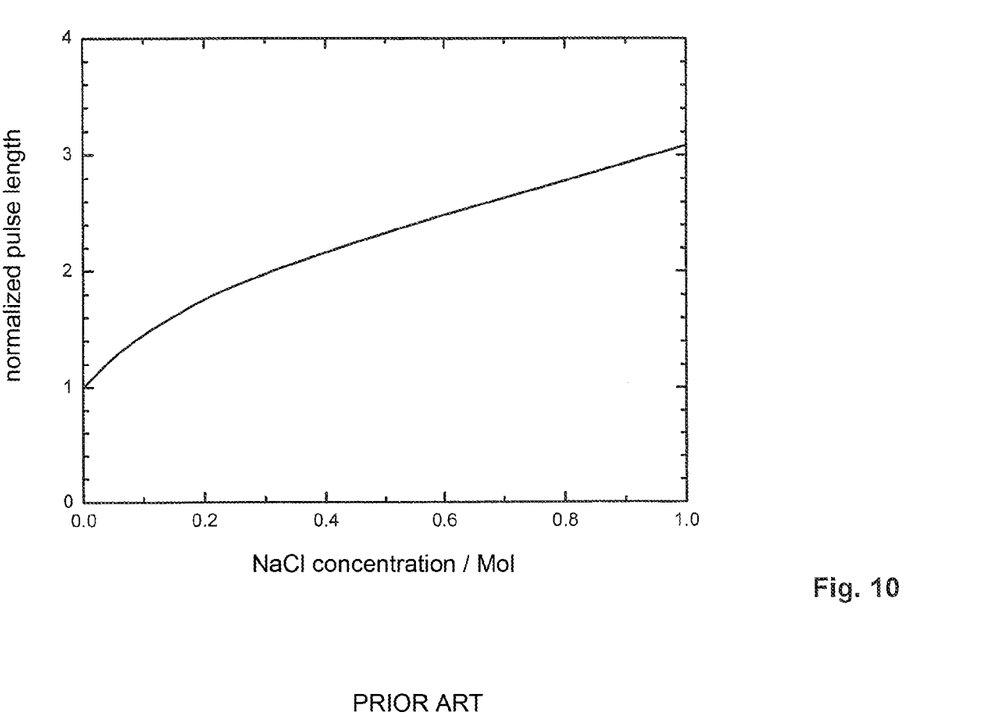
FIG. 10 shows a graph of the pulse duration in dependence on the salt concentration for a measuring head in accordance with prior art.

The reason for the extension of the pulse durations is that, in general, the transmitted power is limited to protect the measuring head from destruction e.g. by dielectric breakdowns. The measuring head therefore realizes the shortest pulse duration $p_{min}$ for a 90° pulse only with loss-free measuring samples, but with lossy measuring samples the pulse durations can be considerably longer, $p_1 > p_{min}$. FIG. 10 shows the extension of the pulse duration ($p_1/p_{min}$) as a function of the salt concentration in the sample for a typical NMR measuring head.

The extension of the pulse duration linearly reduces the spectral width during excitation. The longer the pulses, the poorer the usual spectroscopic quality. Spectral regions which are far away from the excitation frequency, are not or are only insufficiently excited such that the signal intensities at that location are reduced or reception of a signal is no longer possible. It is definitely normal that the pulse duration may be doubled or even tripled over the relevant range of solvent losses. This, however, also means that only half or even only one third of the spectral width is available for excitation. This is particularly and extremely critical for inversion pulses, since these already have a significantly reduced excitation width compared to a 90° pulse. Lossy measuring samples frequently fail to achieve sufficient excitation with inversion pulses such that so-called adiabatic pulses must be used instead. These, however, require a considerably higher dissipated overall power and have a much longer overall duration during which the spin system evolves, and they cannot be used in any situation. For these reasons, it is often desirable to do without such pulses.

One further problem consists in that power amplifiers are generally not adjusted to 50Ω but have a lower resistance in order to increase their efficiency. When the measuring head and certain cable lengths between amplifier and transmitting coil are mismatched, the effectively delivered power may be higher compared to adjustment to 50Ω. This increases the voltage/current in the coil or the network, although the nominally transmitted power is identical. For this reason, the transmission power must be limited to a value that offers sufficient reserves to also cover any mismatches.

For short transmission pulses with high resonator Q-values, the adjustment to 50Ω is not the ideal power adjustment. Due to the high resonator Q-value, transient oscillations occur during which the ideal power adjustment greatly deviates from that of the stationary state. With high (Q>1000) or very high (Q>10000) Q-values and short pulses (p1<10 μs), the stationary state is not obtained during the pulse duration such that the shortest pulse angles cannot be obtained with 50Ω matching.

In practice, there are also situations in which it is not possible to calculate from a known pulse with flip angle $\alpha_1$, pulse duration $p_1$ and power $P_1$, a pulse with a flip angle $\alpha_2$, pulse duration $p_2$ and power $P_2$ without errors. The reasons therefor are e.g. non-linearities of the coil materials that are used over the power range $P_1$ to $P_2$, which, in addition to increased dissipation, also cause mismatches and thereby increased reflection. Such non-linearities may occur e.g. through heating or with superconducting coil materials which are operated close to their critical currents. With very high Q-values or high transmission power, a situation may even arise in which with constant transmission power, a pulse with large flip angle cannot be correctly calculated from a pulse with small flip angle. In the first case, this is due to reflection of the transmitted signal on the resonator due to mismatch during the transient oscillations as mentioned in the previous paragraph. In the second case, the heating due to dissipation of the high power during the pulse is responsible.

It is therefore the object of the invention to propose a method, an NMR probe head, and an NMR system which compensate for occurring losses, in particular without reducing the pulse duration, which correct errors in the calculation of pulses or which automate determination of pulses.

SUMMARY OF THE INVENTION

This object is achieved in accordance with the invention in that the control loop controls the duration and/or the phase and/or the power of the transmitted RF signals, measurement of a parameter is carried out by means of the NMR probe head, which parameter determines the current in or the voltage over one of the RF components, and the transmission powers and/or the phases and/or duration of the RF signals are controlled in dependence on the measured parameter.

Within the scope of the present invention, it has turned out that limitation of the transmission power without adding further parameters is not suitable to efficiently protect a measuring head from being destroyed. An excess voltage generally causes dielectric breakdowns. Otherwise, e.g. with superconducting resonator systems or micro coils, i.e. coils the size of which is in a range of less than one to 1000 micrometers, an excess current causes great dissipation or quenches and thereby destruction of the coils.

The transmitted power is a value that depends on many parameters and is not directly responsible for the destruction. Since the power at the critical component depends on more parameters than just the Q-value and the efficiency of the transmitting coil or the network, e.g. on the correct adjustment, additional losses by the measuring sample etc., the critical value (current in or voltage over the critical component) is limited in the inventive method.

In contrast to prior art, in which a control loop checks whether the power is smaller than a given maximum power and prevents transmission of an excess power on the basis of this information, the inventive method provides measurement of a parameter which permits a statement about the current in or the voltage over a critical component. This measured parameter is then decisive for subsequent regulation.

It is thereby possible to adjust the transmission power in such a fashion that an identical minimum pulse duration $p_{min}$ can be realized with any measuring sample and with any adjustment.

It was moreover found out that an inventive control loop that regulates the duration and/or the phase and/or the power of the transmitted RF signals in dependence on a measured parameter which directly depends on the current or the voltage over one of the RF components, can be used to correct errors in the calculation of pulses and/or to automatically determine pulses, in particular, without measuring an NMR signal.

In the simplest case, the control loop limits the transmission power, wherein the maximum permissible current and/or power values in/over at least one of the RF components are determined.

In this first variant of the inventive method, the Q-value of the RF oscillating circuit and/or the impedance adjustment of the RF oscillating circuit to a transmission line can be measured as a parameter. When the Q-value and the adjustment of the frequency and of the impedance of the RF oscillating circuit are determined, the transmission power $P_1$ associated with a predetermined pulse duration $p_1$ and predetermined flip angle $\alpha_1$ can already be calculated prior to transmission of the first pulse.

Towards this end, the power reflected at the transmission line is preferably measured for measuring the impedance adjustment of the RF oscillating circuit, and the transmission power of the RF signal is adjusted such that $P_S = P_{soll}(Q) + P_R$, wherein $P_{soll}(Q)$ is that power which must be dissipated in the measuring head in order to realize a desired pulse angle $\alpha_{soll}$ with given pulse duration $p_1$ of the RF signals. $P_R$ is the reflected power and $P_S$ is the transmission power of the RF signal.

In a second variant of the inventive method, the pulse duration of an RF pulse with desired pulse angle is measured as the parameter.

The pulse duration is preferably determined by detecting at least one NMR signal using the NMR spectrometer. A nutation experiment with a power $P_S < P_{max}$ can e.g. be performed in this connection.

This variant can be carried out by selecting a starting value, preferably the maximum power of the transmitting coil, for the transmission power, and the NMR signal is recorded by means of the NMR spectrometer, wherein an RF pulse with the starting value of the transmission power is irradiated, the pulse angle of the RF pulse irradiated for generating the NMR signal is determined by means of the recorded NMR signal, and the transmission power of the RF pulse with desired pulse angle and desired pulse duration is determined by this determined pulse angle. "Maximum power of the transmitting coil" means the power which can be approached and realized by the transmitting coil without destroying the coil. With respect to prior art, this variant permits irradiation of a power which may be higher than a predetermined limiting value of the transmission power in case the current in the transmitting coil is smaller than under "ideal" preconditions due to mismatch and/or additional dissipation.

In a third variant of the inventive method, the radio frequency H or E field generated by the RF coil is measured as the parameter. The determination of the radio frequency magnetic field permits exact determination of the pulse. In this method, the dependence of a parameter to be measured on the amplitude and/or phase of the radio frequency electromagnetic field must be initially determined through calibration measurement. Any pulse (with predetermined phase, frequency, flip angle and pulse duration) can consequently be adjusted using the control loop (by measuring and matching this parameter). It is possible to match both the field strength and the phase of the RF field in the measuring sample by modifying phase and transmission power.

The radio frequency H or E field generated by the RF coil is thereby advantageously measured using a probe which is coupled to one of the RF components of the adjustment network or directly to the transmitting coil. In addition to the advantageous time savings due to automated regulation of the pulse angle prior to an NMR experiment, the possibility of pulse determination for extremely diluted measuring samples is also particularly relevant: the pulse angle can be exactly measured by a probe even when a very low signal-to-noise ratio prevents measurement of a significant NMR spectrum for a certain measuring sample within a reasonable time period. This is generally the case for decoupling nuclei such as 13C or 15N when these are present in their naturally occurring number in the measuring sample and integration of hundreds or thousands of scans is required for determining the pulse angle. In accordance with prior art, no pulse is determined in such a situation, but the pulse of a comparative measurement is used thereby using another measuring sample (enriched with these isotopes).

The third variant of the inventive method offers the possibility of adjusting the transmission powers and/or the phases of the RF signals for the duration of one pulse sequence, wherein several measurements of the radio frequency H or E field generated by the RF coil are performed during the pulse sequence. Within the context of the current invention as disclosed and claimed, a pulse sequence is a series of RF pulses which is terminated with the acquisition of a free induction decay, while an NMR experiment consists of the repetition of a pulse sequence with multiple acquisitions of free induction decays. In this method variant, several values are determined for several pulses of a pulse sequence. In this fashion it is possible to correct artefacts due to heating effects of the network, non-linearities of the RF coils or RF components and accumulation effects that occur when the decay times are longer than the periods between transmission of two pulses at the same frequency or with simultaneous transmission of pulses having different frequencies.

In an alternative fashion, it may also be advantageous for the transmission powers and/or the phases of the RF signals to be adjusted for the duration of one single pulse, wherein the radio frequency H or E field generated by the RF coil is measured in dependence on time. In this variant, the excitation and decay times of the RF coil including transmitter, power amplifier and any filters that may possibly be provided in the transmitting path are taken into consideration. This is advantageous, in particular, for RF coils with high Q-value, in which the time constant is of the same magnitude as the pulse length. At the start of the transient oscillations, the major part of the transmission power is reflected. Only within the course of the transient oscillations is the power completely received and dissipated in the system consisting of resonator and measuring sample. For this reason, it is possible to use a transmission power which is considerably higher than $P_{max}$ at the start of a pulse without reaching the power limits of the RF coil, whereas towards the end of the pulse, the power must be brought down again to the maximum power. In accordance with the inventive method, a dynamic value is measured during a pulse (H or E field as function of time for the duration of a pulse), thereby permitting risk-free use of transmission powers which are larger than the maximum power $P_{max}$.

In a particularly preferred fashion, the transmission power is regulated for the duration of a pulse in such a fashion that the RF pulse shape that is thereby generated largely corresponds to a previously determined pulse shape. The error of the flip angle for the excited spin system should thereby be less than 20°, preferably less than 10°, with respect to the theoretical value.

In one particularly preferred variant of the inventive method, the RF pulses are determined without measuring an NMR signal from the measuring sample, i.e. a pulse sequence is irradiated and the H field and/or E field thereby generated is/are measured without waiting for a system response. This is particularly advantageous, since the requirements for measurement of a significant NMR signal are very high. It is thereby moreover possible to precisely adjust exactly defined pulse angles or complex spin operations.

Prior to recording of an NMR spectrum, so-called "dummy scans" are generally performed. During these scans, the full pulse sequence is irradiated onto the measuring sample without measuring a signal. The dummy scans are used to balance the system (on the one hand thermally and on the other hand to give the spin system a new equilibrium magnetization which generally differs from that of the undisturbed system). In this particularly preferred embodiment of the invention, the pulses can be finely adjusted during the "dummy scan" such that the fine adjustment can be performed without time loss for the measurement.

The invention also concerns a nuclear magnetic resonance (NMR) probe head for performing a method as described above, wherein the probe head comprises a probe for measuring the current in and/or the voltage over the RF coil and/or for measuring the RF field which is generated by the RF coil.

The probe preferably comprises a component that is inductively coupled to the RF coil or one of the RF components and is used to measure the current in the RF coil or the RF field generated by the RF coil. The probe may e.g. be designed as a pick-up loop.

In an alternative fashion, the probe may comprise an electrode which is capacitively coupled to an RF coil or at least one of the RF components and is used to measure the voltage over the RF component. The probe may e.g. be designed as a coaxial cable with projecting core or a capacitor plate.

Inductive coupling is basically to be preferred over capacitive coupling, since capacitive coupling initially only measures the E field of the RF coil, which, however, changes due to the presence of the measuring sample with its dielectric constant and due to the adjustment of tuning capacitors such that it can have a very complex dependence on the magnetic field of the RF coil. In practice, however, it is very difficult to provide a purely inductive coupling such that one generally obtains a type of mixing effect.

The invention also concerns a nuclear magnetic resonance (NMR) system for performing the above-described method, comprising a spectrometer, a control loop, and a probe head with RF components, wherein the spectrometer comprises a transmitter that transmits RF signals at measuring frequencies with transmission power, the control loop controls the duration and/or the phase and/or the power of the transmitted RF signals, the NMR probe head contains at least one RF oscillating circuit which is tuned, by means of RF components, to the resonance frequency of the type of nucleus to be investigated. The RF oscillating circuit comprises at least one RF coil which is disposed around the measuring sample and, by transmitting RF signals, is used to excite nuclear spins in a sample and to receive NMR signals resulting from this excitation, wherein the NMR probe head may contain further RF components which may be components of RF oscillating circuits, of the coupling and filter networks. In accordance with the invention, the control loop is suited to regulate the transmission powers and/or the phases of the RF signals in dependence on the measured parameter.

The inventive NMR system preferably comprises a probe head as described above.

Further advantages of the invention can be extracted from the description and the drawing. The features mentioned above and below may be used individually or collectively in arbitrary combination. The embodiments shown and described are not to be understood as exhaustive enumeration but rather have exemplary character for describing the invention.

DESCRIPTION OF THE PREFERRED EMBODIMENT

Figure 5:
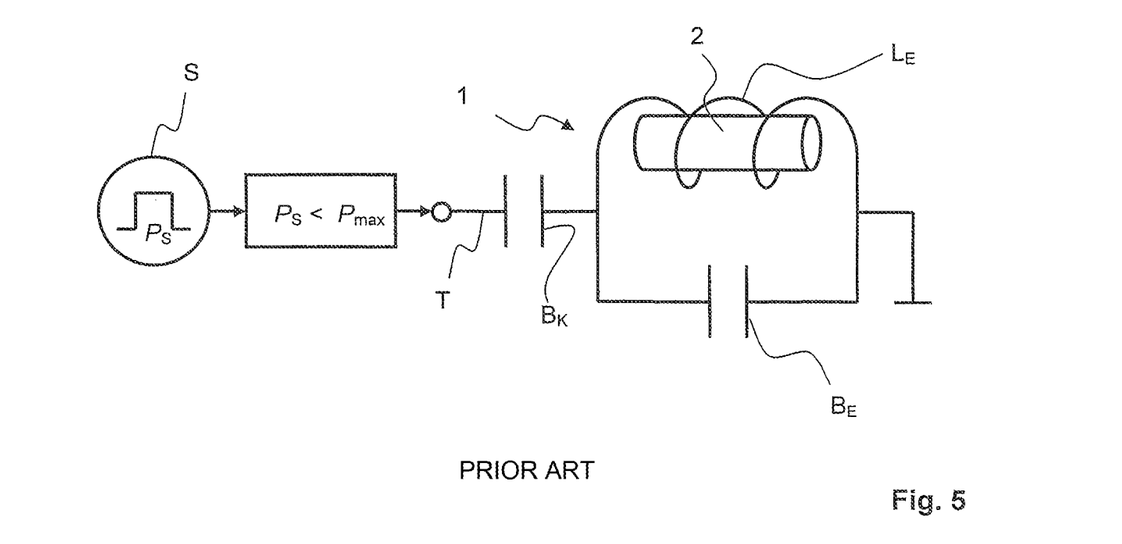
FIG. 5 shows a control loop (power limiter) according to prior art.

FIG. 5 shows a control loop of an NMR measuring head according to prior art, in which regulation of the signal power $P_S$ is performed using a fixed limiting value, preferably the maximum power $P_{max}$, i.e. the control loop functions as a simple limiter. A pulse or a pulse sequence is generated in the NMR spectrometer. The control loop checks whether the transmission power is within the power limits that are defined for the measuring head, and permits transmission only in case the value is permissible. The measuring head comprises an oscillating circuit 1 with an RF coil $L_E$ and an RF component $B_E$ in the form of a capacitor. The oscillating circuit is connected to the transmitter of the spectrometer S via a transmission line T. An additional RF component $B_K$ is connected in series with the oscillating circuit 1 for adjusting the impedance of the oscillating circuit 1 to the transmission line T. The measuring head may contain further RF components which are not illustrated herein.

Limitation of the transmission power to the maximum power $P_{max}$ is reasonable as a safety measure to protect the measuring head but the protection is at a level which is clearly too low for certain situations, and is insufficient in other situations.

With defined adjustment to the transmission line impedance (generally to 50Ω), a measuring head requires a minimum amount of power in order to obtain a certain pulse duration when it is empty (or provided with a loss-free measuring sample) and the pulse duration is long compared to the time constant of the resonator. Depending on mismatch and reflections in the components and transmission lines T, the measuring head may even require less power for the same current in the coil $L_E$ since the portion of the reflected power $P_R$ at the output of the spectrometer (of the transmitter) may be less compared to adjustment to the impedance of the transmission line. In order to counteract this effect, the limiting value determined for the transmission power is generally provided with sufficient reserve.

When the measuring head is not ideally adjusted (first situation), a certain portion of the transmitted power $P_S$ is generally reflected on or in the measuring head such that the power available in the transmitting coil $L_E$ is smaller than in case of perfect adjustment. In order to obtain a desired pulse angle, the pulse duration must consequently be selected to be longer with identical transmission power $P_S$. With high Q-values, this effect may, however, also be exactly opposite (second situation) and the pulse duration may even be reduced with nominal mismatch. It is thereby decisive whether the adjustment was excessive or insufficient, i.e. whether the loaded Q-value of the resonator is higher or lower compared to "correct" power adjustment to the transmission line.

In this first situation, the transmission power $P_S$ never completely reaches the measuring head or respectively the coil $L_E$. For this reason, all voltages over the RF components and the coils are lower than would basically be possible and the danger of a dielectric breakdown exists only at higher power levels. The permissible maximum power $P_{max}$ is not reached in the measuring head.

In contrast thereto, in one variant (variant 1) of the inventive method, the reflected power $P_R$ is measured and the transmission power $P_S$ is adjusted in such a fashion that not the transmission power $P_S$ alone, rather the transmission power $P_S$ minus the reflected power $P_R$ determines the power $P_{soll}$ ($Q_0$) which must be dissipated in the measuring head, in order to realize a desired pulse angle with given duration of the RF signal. For the shortest pulse that can be realized with this measuring head, $P_{soll}(Q_0)=P_{max}$ applies. For this correction of the reflected power, determination of the Q-value $Q_0$ of the oscillating circuit without measuring sample is not required.

A second situation arises when a lossy measuring sample is introduced into the measuring head. The additional losses reduce the Q-value of the loaded oscillating circuit 1 ($Q<Q_0$), thereby reducing the increased resonance current. The pulse angles become longer with identical transmission power $P_S$ since part of the transmission power $P_S$ is dissipated in the measuring sample 2 and not in the measuring head.

The transmission power $P_S$ is limited in order to protect the measuring head from dielectric breakdowns, from quenching superconducting components or burning through components due to excess current. Since the voltage applied over the transmitting coil $L_E$ or over the components $B_K$ of the tuning network does not directly depend on the transmission power $P_S$ but on several parameters, the protection in accordance with prior art is too "hard".

Due to the additional dissipation in the measuring sample 2, only part of the transmission power $P_S$ is dissipated in the measuring head and the rest is dissipated in the measuring sample 2. Since it is not the power that destroys the measuring head but voltage or current, and the voltage is substantially proportional to the current in the coil or the tuning network, there is no risk of destroying the measuring head even when a transmission power $P_S$ is used which is higher than the maximum power $P_{max}$. In accordance with the invention, the transmission power $P_S$ can be increased until the power dissipated in the measuring head corresponds again to the maximum power $P_{max}$. This means that the transmission power may be identical to the maximum power plus the power dissipated in the measuring sample 2.

One possibility of determining the power dissipated in the measuring sample is to measure the Q-value of the oscillating circuit with measuring sample and compare it with the Q-value $Q_0$ without measuring sample. In this fashion, the transmission power $P_S=P_{soll}(Q)>P_{soll}(Q_0)=P_{max}$ can be irradiated without having to bear the risk of dielectric breakdowns in the measuring head.

When the transmission power is correspondingly adjusted, the NMR spectrometer yields the same pulse duration with each measuring sample and with each adjustment (within the scope of the overall available power and the permissible reflections). Reflections are permissible when the further components on the transmission path are not damaged, i.e. for example, when no dielectric breakdowns can occur in the transmitting/receiving switch or in filters or when the power amplifier of the transmitter themselves cannot be damaged.

A third situation is created, in particular, for measuring heads with superconducting materials, which are operated close to their critical current and with coils of conventional conducting materials when the temperature of the conductor changes during the duration of a pulse or a pulse sequence due to the power dissipated in the oscillating circuit 1.

In these cases, the resistance of the coil $L_E$ changes as a function of the current in the coil $L_E$ such that the resonator Q-value and thereby also the adjustment, change under load. This generally results in that, with higher transmission power, pulse angles become longer than inversely proportional to the square root of the transmission power. This effect is called power dependence of the Q-value. This effect is particularly disturbing with so-called shaped pulses, i.e. pulses the amplitude and phase of which are varied over the pulse length since the calculated pulses partially clearly differ from the effectively transmitted pulses and for this reason, the spin operations can no longer be correctly performed. In addition to amplitude errors, phase errors may also occur due to power dependence on components in the transmission path.

In order to correct these non-linearities, they must be measured and stored in a correction table. One problem thereby is that the non-linearities do not only depend on the transmission power $P_S$ but also on the current in the critical components. This current, however, is not only a function of the transmission power $P_S$ but also of the adjustment (tuning/matching) and of the losses on the measuring sample 2. A simple correction table consequently solves only part of the problem.

Another variant of the invention (variant 2) is therefore better suited for this object, in which variant the transmission power is increased until the pulse angle has reached a desired value $\alpha_{soll}$ with given pulse duration $p_1$. This method is disadvantageous in that an NMR measurement of the pulse angle must be possible within a reasonable time (a fraction of the effective measuring time with the measuring sample). Moreover, the correction of shaped pulses is essentially impossible to perform and the method can therefore only be used for hard pulses.

The third variant of the invention offers, in addition to an elegant solution of the problem of effective protection of the measuring head from destruction by excess transmission powers, also further advantages of an "intelligent" NMR transmission system which can be completely automated. In this third variant, a parameter is measured in the measuring head by means of a probe, wherein the parameter depends, to a known or determinable extent, on the radio frequency field generated in the measuring sample. Regulation of the transmitting signals using this parameter permits corrections of any deviations which are e.g. due to imperfections of the apparatus, and thereby transmission of exactly predeterminable RF fields within the scope of the possibilities in the generation of RF pulses. Protection of the measuring head from dielectric breakdowns is only one aspect of the possibilities in this variant.

Figure 1:
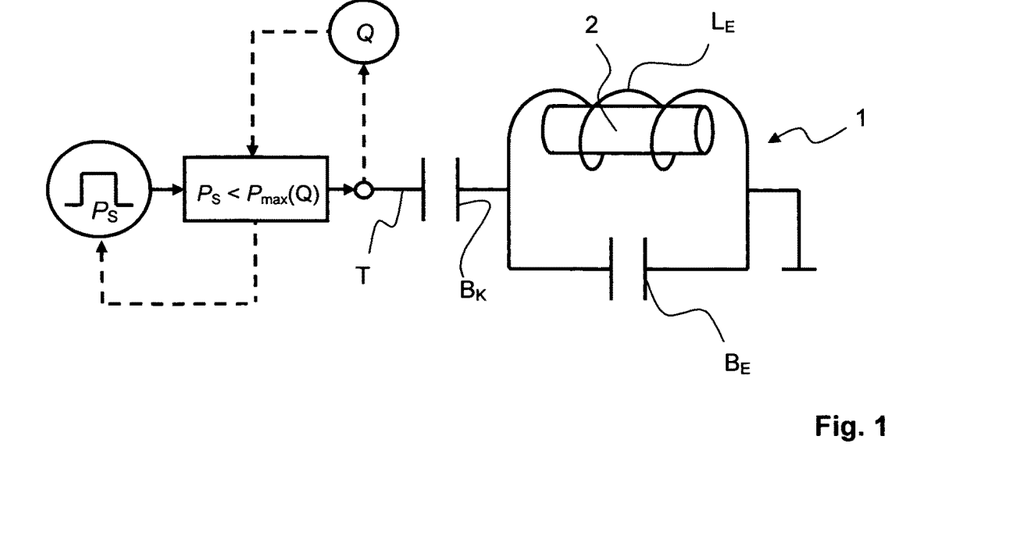
FIG. 1 shows a control loop in accordance with variant 1 of the inventive method, in which the transmission power is controlled in dependence on the measured Q-value.

In order to protect the measuring head from dielectric breakdowns even when a transmission power $P_S$ above the maximum power $P_{max}$ is permissible, the invention consequently offers several possibilities:

Variant 1:

The Q-value of the RF oscillating circuit 1 and/or the impedance adjustment of the RF oscillating circuit 1 to the transmission line T is measured and the transmission power $P_S$ is correspondingly adjusted (FIG. 1).

Figure 2:
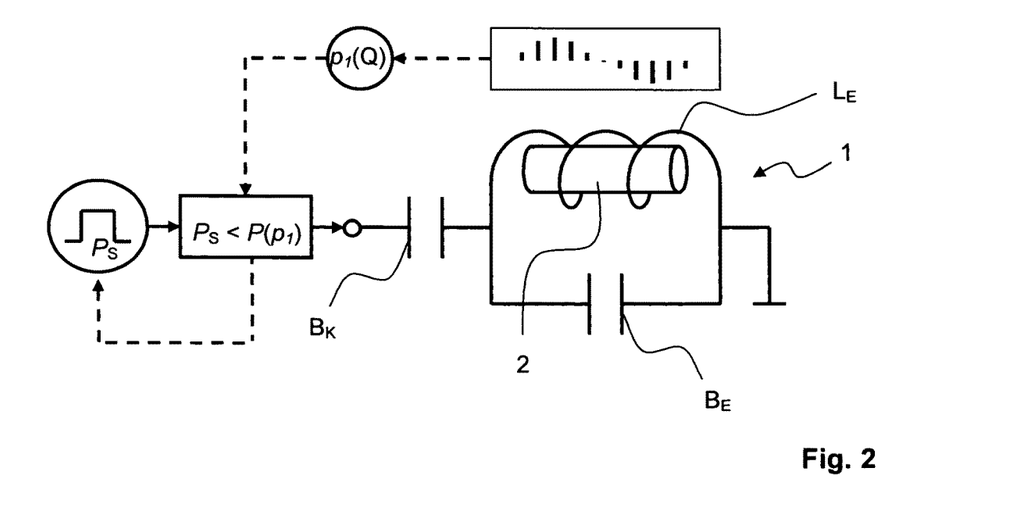
FIG. 2 shows a control loop in accordance with variant 2 of the inventive method, in which the transmission power is controlled in dependence on the measured pulse duration of an RF pulse.

Variant 2:

The transmission power $P_S$ is increased until the shortest permissible pulse duration $p_{min}$ is reached, wherein the shortest permissible pulse duration $p_{min}$ is reached when the permissible maximum power $P_{max}$, i.e. the power just below that at which the RF components are destroyed, is dissipated in the measuring head (FIG. 2).

Figure 3A:
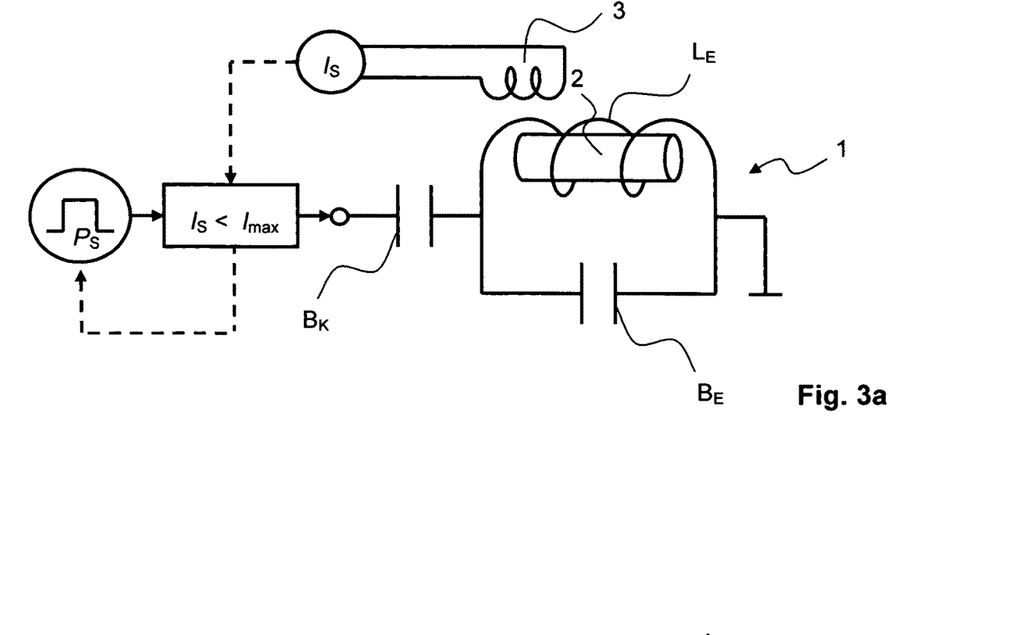
FIG. 3a shows a control loop in accordance with variant 3 of the inventive method with an inductively coupled probe, in which the RF signals are regulated in dependence on the radio-frequency H or E field of the RF coil.
Figure 3B:
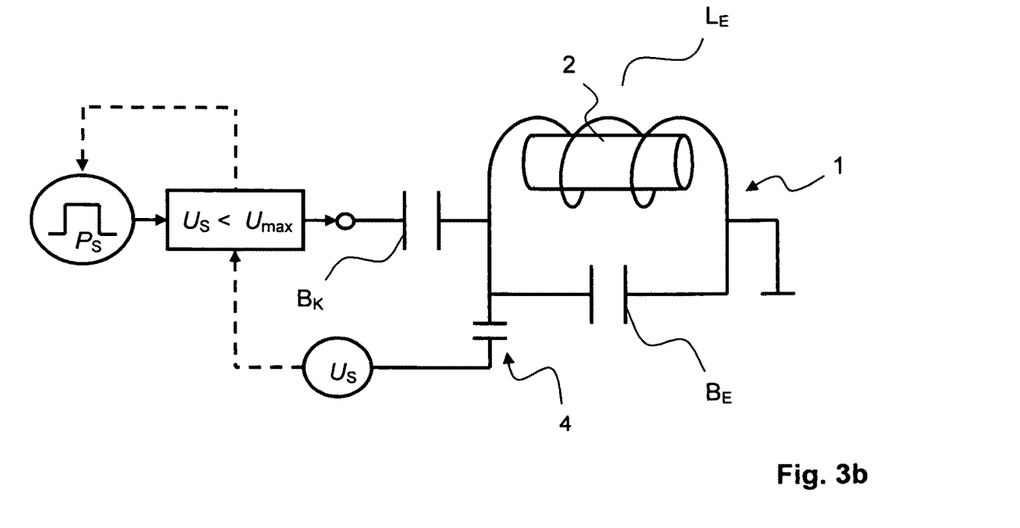
FIG. 3b shows a control loop in accordance with variant 3 of the inventive method with a capacitively coupled probe, in which the RF signals are regulated in dependence on the radio frequency H or E field of the RF coil.

Variant 3:

The field generated by the transmitting coil is measured and the transmission power is increased until the permissible maximum power is reached (FIGS. 3a, 3b).

All variants have in common that a parameter is measured using an NMR probe head, via which parameter the current in or the voltage over one of the RF components $B_E$, $L_E$, $B_K$ (critical component) can be determined and that the RF signals (in particular, the transmission powers $P_S$, the phase, the duration of the RF signals) are regulated in dependence on the measured parameter. The transmission power $P_S$ of the RF signals can thereby be limited in such a fashion that the maximum permissible current and voltage values, i.e. the marginal current and voltage values that do not yet destroy the relevant component, are not exceeded in any of the RF components or RF coils.

A probe head for carrying out the inventive method comprises at least one RF oscillating circuit 1, which is tuned by means of RF components $B_E$ to the frequency of a type of nucleus to be examined. This at least one RF oscillating circuit 1 contains at least one RF coil $L_E$ which is disposed around a measuring sample 2 and can excite certain nuclear spins in the sample container and receive the resulting NMR signal. The NMR probe head may also contain additional RF components $B_K$ which may be components of RF oscillating circuits 1, of coupling and filter networks. The NMR probe head has at least one connection for respectively feeding an RF signal with which certain nuclear spins can be excited in the measuring sample 2 by means of the RF coils $L_E$.

All three methods permit further corrections beyond the limitation of the transmission power:
  in the first method, pulse angles can be predetermined by measuring the Q-value and reflection without the experimental determination of a pulse angle using an NMR signal;
  in the second method, non-linearities which occur in pulsed operation can be corrected;
  in the third method any RF pulses can be determined and also errors e.g. due to non-linearities, power dependencies, superposition of signals, transient oscillations etc. can be corrected without measuring an NMR signal.

A control circuit that can be used for the first variant is shown in FIG. 1. The Q-factor is e.g. determined through the bandwidth of an absorption curve during sweeping of the frequency of a quasi cw (continuous wave) signal.

Variant 1 is advantageous in that the correct transmission power can already be determined prior to transmission of the first pulse, i.e. pulse angle determination is basically superfluous when the Q-value and the adjustment have been measured with sufficient precision.

Disadvantageous thereby is that these measurements are generally performed with quasi continuous wave and the current in an oscillating circuit with Q-value Q cannot rise instantaneously. For this reason, there is less current in the oscillating circuit, in particular, with short pulse duration, compared to long or very long (quasi cw) pulse duration, mainly when the Q-value is very high. This means that an important part of the transmitted wave is reflected on the transmitting coil $L_E$. The corrections required in this connection can, however, be calculated. The transmitted and reflected wave may alternatively be measured by means of a directional coupler such that correction is performed with measured values.

FIG. 2 shows a control circuit for performing variant 2.

Variant 2 is advantageous in that the exactly correct pulse angles are determined for the measuring sample 2. This is most effectively performed with an automatic routine which adopts the safety limits for the probe head. The maximum power $P_{max}$ may be selected as initial value $P_{S0}$ for the transmission power $P_S$, the pulse angle may be determined and the transmission power $P_S$ can then be increased such that the pulse duration is adjusted to a defined desired value $P_1(Q)$ ($P_S<P(p_1)$). Since the current in the resonator is (indirectly) measured, the power $P(p_1)$ may also be larger than $P_{max}$. The pulse duration may alternatively also be varied until the pulse angle is adjusted to a defined desired value. An RF pulse with the initial value $P_{S0}$ of the transmission power is irradiated to determine the pulse angle, and the resulting NMR signal is recorded.

This variant 2 guarantees an exactly determinable pulse angle, however, only when the measuring sample provides sufficient signal such that pulse angle determination is possible within a reasonable amount of time. It must thereby be considered, however, that the pulse angle must be determined even when the pulse duration and not the pulse power is to be adjusted.

One disadvantage of variant 2 is the time required for determining the pulse angles for normal measuring samples. In many situations, effective determination of the pulse angles is just not possible due an to insufficient signal. Variant 2 of the inventive method will therefore mainly be used for calibration purposes for one of the two other methods.

Variant 3 combines the advantages of the first two variants. Determination of the magnetic field generated by the transmitting coil $L_E$ permits exact determination of the pulse angle even when the signal-to-noise ratio of the measuring sample 2 (or the relaxation times) does not permit measurement of an NMR spectrum within a reasonable amount of time. It is moreover possible in case of in-situ monitoring of the transmission field (H or E field) to interrupt transmission or clip the power of the transmission pulse when the maximum power is exceeded and the voltages in the oscillating circuit reach a level at which a dielectric breakdown or burn out of a critical component is to be feared.

Such an in-situ field measurement can e.g. be performed by a capacitively or inductively coupled probe. FIG. 3a shows a control circuit with a probe 3 that is inductively coupled to the RF coil $L_E$. FIG. 3b shows a control circuit with a probe 4 that is capacitively coupled to the oscillating circuit.

The probes 3, 4 may be inductively and capacitively coupled to any of the RF components $B_K$ and $B_E$ and also to stray fields, in particular to the electric or magnetic stray field of the coils $L_E$.

Figure 4:
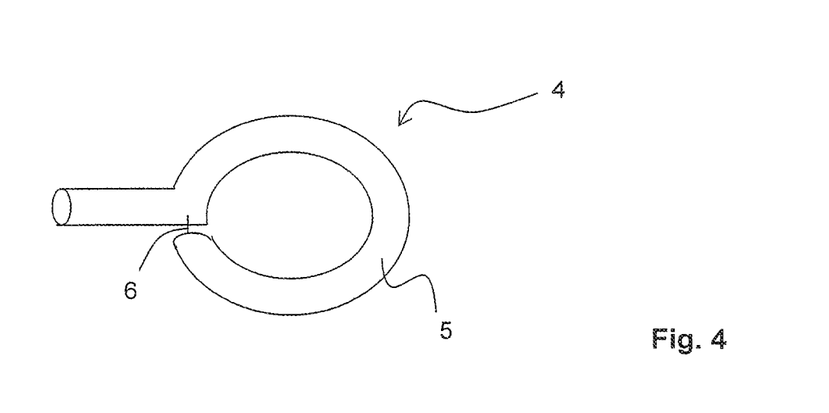
FIG. 4 shows a probe in the form of a coaxial cable which is bent into a loop with a core that is soldered to the shielding.

In a measuring head with more than one measuring frequency, such a probe 3, 4 can be easily coupled to all channels and have a corresponding broad-band design such that the fields of all channels can be determined. A specific embodiment for measuring the H field would e.g. be a pick-up loop that is very weakly inductively coupled with all transmitting coils $L_E$. When transmission is in the range of between approximately −30 dB to −70 dB, the receiving electronics of the spectrometer, i.e. the NMR receiver with which the detected NMR signals are normally processed, can be directly used for field measurement. If the coupling is too strong, a damping element may be connected between the pick-up loop and the preamplifier or the spectrometer input. A mainly capacitively coupling probe 4 may e.g. be designed as an open coaxial cable with slightly projecting core. In an alternative fashion, a small capacitor plate which couples to the electric fields of the different transmitting coils $L_E$ may be installed or a capacitor with low capacitance may be connected to the transmitting coils $L_E$ or other RF components. FIG. 4 shows a probe 3 which substantially only couples to the magnetic fields. This is achieved in the illustrated example by means of a shielding. A coaxial cable 5 may e.g. thereby be bent to form a loop and the core 6 may be soldered to the shielding of the coaxial cable. The broad-band characteristic of the probe can be obtained by largely correct termination of 50Ω and a small inductance.

One further possibility is the use of the residual coupling between the used coils $L_E$ or transmitting/receiving channels in a measuring head for several measuring frequencies. Such a head has one or more transmitting/receiving channels per measuring frequency. Transmission on the proton channel can thereby be measured e.g. via the carbon channel or in case two or more proton channels are provided (in "quadrature" or as "array") be measured by another channel of the same measuring frequency. It is thereby disadvantageous that the measuring heads are generally designed in such a fashion that simultaneous decoupling during the measurement at another measuring frequency is possible such that transmission between the channels is generally performed with extremely high damping. This damping is generally at least partially obtained by filters. Only when tapping upstream of the filters is possible can the respectively other transmitting/receiving coil be used for field measurement of the transmission field.

Compared to all measurements outside of the transmitting coil $L_E$, the in-situ field measurement of variant 3 offers the great advantage that it permits direct measurement of the current/voltage in the critical component instead of measurement of the superposition of the transmitted and reflected wave.

The greatest advantage of this method is the determination of the exact pulse angles for an experiment without NMR measurement. Towards this end, only a "dummy scan" must be performed, i.e. the pulse sequence without recording the response of the system in the receiver with simultaneous field measurement. The correct pulse angles can be determined from this field measurement. This method functions precisely for any measuring samples with any electric loss even when the measuring heads are non-linear with respect to the transmission power $P_S$, i.e. the pulse angles do not inversely proportionally depend on the square root of the transmission power, the adjustment is not exact and mainly when the measuring sample 2 contains insufficient measuring substance in order to be able to determine the pulse angles at a measuring frequency within a short time period.

One further advantage of variant 3 consists in that the exact pulse shape can be determined and pulse distortions can be corrected through preemphasis.

Figure 6:
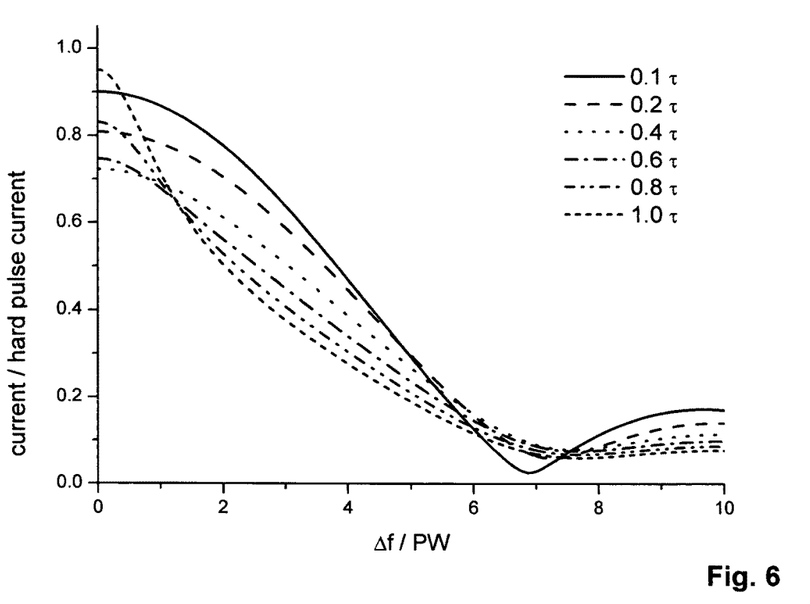
FIG. 6 shows a graph of the reduction in width of the frequency spectrum of a rectangular transmission pulse in dependence on the ratio between pulse width and time constant (inversely proportional to the Q-value of the oscillating circuit); the Bloch equations would have to be solved to consider the effective excitation width of the spins.
Figure 7A:
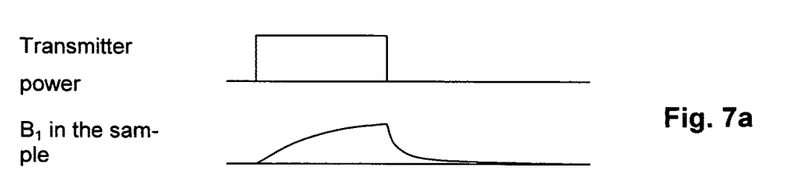
FIG. 7a shows an RF pulse with rectangular pulse shape and the resulting saw-tooth shaped $B_1$ field in the measuring sample.

This may become necessary to obtain a maximum excitation width for probe heads with very high Q-values. When the time constant of the resonators is within an order of magnitude of the desired pulse lengths, the effective pulse shape changes from a rectangular pulse into a type of sawtooth-shaped pulse (FIG. 7a). In the limiting case, the effective excitation width of such a pulse is no longer determined by the nominal pulse length but merely by the time constant of the oscillating circuit 1. FIG. 6 shows the reduction of the spectral width in dependence on the pulse duration for different ratios between pulse duration and time constant of the oscillating circuit. The Q-value of the oscillating circuit 1 was thereby increased with constant pulse duration. The effective excitation width in the NMR still differs from the spectral width of the pulse shown in FIG. 6 since the Bloch equations must be solved for the spin system.

Figure 7B:
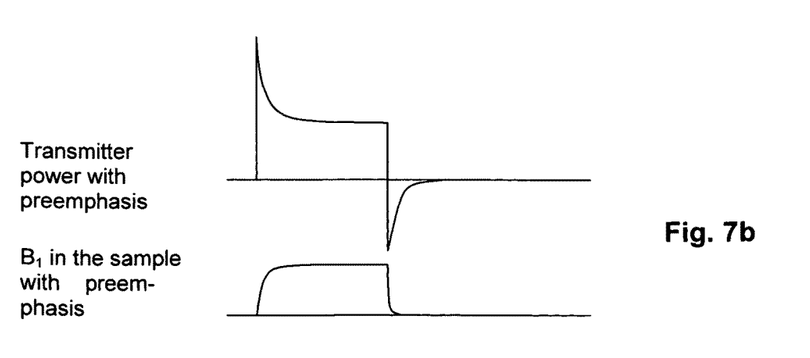
FIG. 7b shows an RF pulse with preemphasis and the resulting approximately rectangular $B_1$ field in the measuring sample (adjustment of the RF signal for the duration of an RF pulse)

In accordance with the invention, instead of sending a rectangular pulse, an approximately rectangular current pulse is generated in the coil $L_E$ through preemphasis (FIG. 7b) in order to obtain a wider excitation. This requires, in particular at the start of the pulse, transmission powers of a magnitude of a multiple of the nominal maximum power $P_{max}$ of the measuring head. An in-situ measurement of the critical coil parameters (E or B field) permits risk-free use of such high transmission powers. Moreover, exact measurement of the generated pulse shape promotes adjustment of the transmission power $P_S$, since, in this case, the excitation and decay times of the overall amplifier chain and filters in the transmission path are taken into consideration. This is not the case when only the measured coil Q-value is taken into consideration in the calculation of the preemphasis.

Figure 8A:
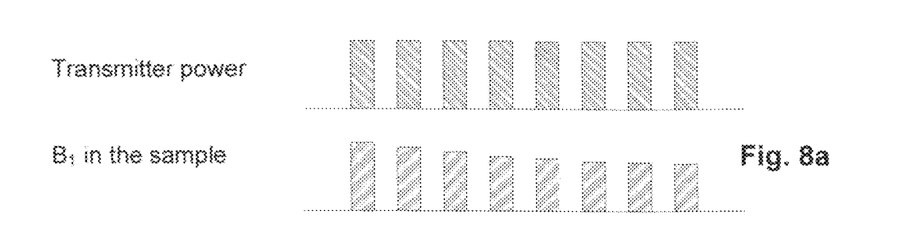
FIG. 8a shows a pulse sequence comprising pulses with identical transmission powers and the resulting decaying $B_1$ field in the measuring sample.
Figure 8B:
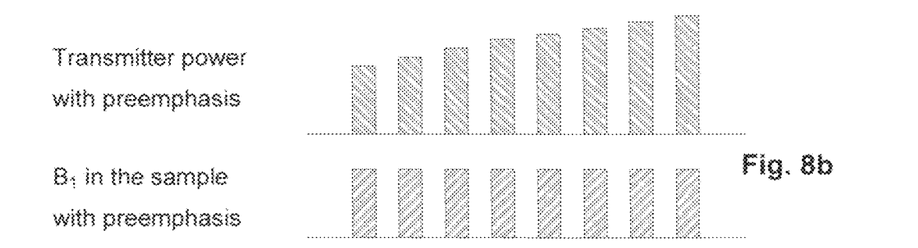
FIG. 8b shows a pulse sequence comprising pulses with different transmission powers and the resulting constant $B_1$ field in the measuring sample (adjustment of the RF signal for the duration of an RF pulse sequence)

In addition to these advantages, it is possible to correct typical artefacts due to heating effects of the network or non-linearities of the coils $L_E$ by means of the inventive in-situ measurement. For some pulse sequences, the power dissipated in the probe head causes detuning of the oscillating circuit for the duration of the experiment (FIG. 8a). This problem cannot be solved by reducing the duty cycle, i.e. the ratio between pulse duration and waiting time between the pulses. When the pulses are no longer correctly executed due to shifting of the working point of the measuring head, i.e. a change in frequency adjustment to the transmission frequency and/or impedance adjustment to the transmission line, either artefacts (e.g. phase errors) or signal loss may result. In the inventive in-situ monitoring of the generated B fields, the spectrometer can correct these effects by using different transmission powers $P_S$ or also other transmitting phases for the same pulses for the duration of the pulse sequence (see FIG. 8b). Effects of the Q-value on the pulse shape were thereby neglected.

Figure 9:
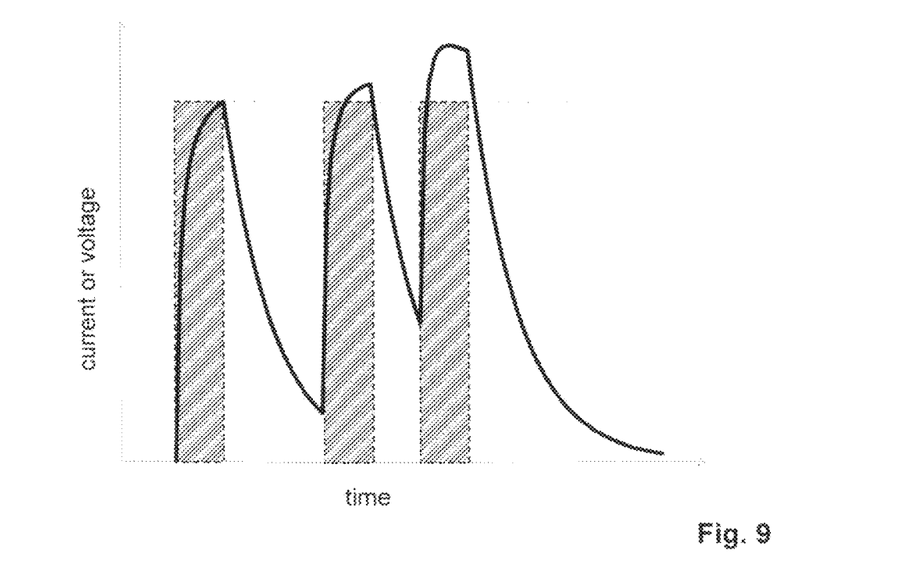
FIG. 9 shows an example of a pulse sequence with three pulses with maximum transmission power; the current/voltage limit of the probe head is exceeded by superpositioning the second and third pulse with the decaying pulses.

When the separation between the pulses is selected to be short with respect to the time constant of the resonator, the measuring head accumulates power that could cause destruction. One further advantage of the in-situ measurement of the critical coil parameters consists in that in this case, the accumulated currents/voltages in the resonator are taken into consideration and not only the transmission power $P_S$. Such a situation is illustrated in FIG. 9. The hatched blocks represent the transmitted pulses, i.e. current/voltage in the coil in case of very small coil Q-values. The solid thick line represents the current or the voltage at a time constant of the coil, which is in the order of magnitude of the pulse duration. The pulse shape of any individual pulse (and thereby also the decay) can then be corrected through preemphasis. When fast preemphasis over one single pulse is not possible, at least the transmission power of the individual pulses can be adjusted in such a fashion that the accumulated current/voltage never exceeds the permissible limiting value in the critical components of the measuring head.

When the in-situ measurement of the critical coil/network parameters (current/voltage) is not performed with broad bandpass and excitation is simultaneously performed at different frequencies, the accumulated voltage or the accumulated current is not detected such that reliable protection is only ensured through mathematical addition of the detected parameters. For reliable realization, the locations of possible superposition of currents or voltages and the relationship of the generated amplitudes between measuring location and the position of the strongest superposition must be known for each measuring frequency. Prior art does not consider this case such that, in general, the permissible transmission powers must be manually reduced by a factor of two to four. Protection of the measuring head is consequently either not provided or the transmission power $P_S$ is, as a precaution, limited to a half or even to only one quarter of the maximum power $P_{max}$ which, however, in many cases would not have been necessary to this degree.

The inventive method limits the signal power $P_S$ of the RF signal in such a fashion that the maximum permissible current and voltage values, which could destroy the relevant component, are not exceeded in any of the radio frequency components $L_E$, $B_E$, $B_K$.

List of Reference Numerals 1 oscillating circuit
2 sample
3 inductively coupled probe
4 capacitively coupled probe
5 coaxial cable
6 core
$B_E$ RF component of the oscillating circuit
$B_K$ additional RF component
$L_E$ RF coil
$P_S$ the transmission power is the nominal power which is output by the transmitter (signal power)
$P_R$ the reflected power is the part of the power that is reflected at the probe head and never reaches the transmitting coil $P_{soll}(Q_0)$ the power that must be dissipated in the measuring head in order to realize a desired pulse angle with given duration of the RF signal when the measuring head is provided with a loss-free measuring sample or with no measuring sample at all $P_{soll}(Q)$ the power that must be dissipated in the measuring head in order to realize a desired pulse angle with given duration of the RF signal when the measuring head is provided with any measuring sample $P_{max}$ the maximum power=the power at which a voltage is applied to the critical components of the probe head, and at which a current flows through the critical component, which voltage and current are slightly below levels at which destruction of a critical component occurs. When the maximum power in the measuring head is dissipated, the smallest possible pulse angle is obtained $P_{min}$ the shortest permissible pulse duration for a 90° pulse $P_1(Q)$ the pulse duration in dependence on the Q-value of the resonator (in FIG. 2 this is a measured value, the value of the pulse duration can, in principle, also be calculated)

$P(p_1)$ the power associated with a pulse with a given flip angle and duration (since the current in the resonator is (indirectly) measured, the power in variant 2 may also be larger than $P_{max}$)

S spectrometer

T transmission line

I claim:

1. A method for regulating radio frequency (RF) signals in a nuclear magnetic resonance (NMR) system, the NMR system having a spectrometer, a control loop, and an NMR probe head with RF components, the method comprising the steps of:
    a) transmitting, using a transmitter disposed in the NMR spectrometer, RF signals at measuring frequencies and with a transmission power;
    b) tuning, using the RF components, an RF oscillating circuit disposed in the NMR probe head to a resonance frequency of a type of nucleus to be investigated;
    c) utilizing the RF oscillating circuit to excite nuclear spins In a sample and to receive NMR signals resulting from excitation of those nuclear spins, the RF oscillating circuit having at least one RF coil which is disposed around the sample to emit and receive RF signals;
    d) controlling, using the control loop, a duration, phase and/or power of the transmitted RF signals;
    e) measuring a parameter using the NMR probe head;
    f) determining, using the parameter measured In step e), a current in or a voltage across one of the RF components; and
    g) regulating transmission powers, phases and/or durations of the RF signals in dependence on the parameter measured in step e), wherein the control loop limits the transmission power, maximum permissible current and/or voltage values being determined in at least one of the RF components.

2. The method of claim 1, wherein a Q-value of the RF oscillating circuit and/or an impedance adjustment of the RF oscillating circuit to a transmission line are measured as the parameter.

3. The method of claim 1, wherein a pulse duration of an RF pulse with desired pulse angle is measured as the parameter.

4. The method of claim 3, wherein the pulse duration is determined by detecting at least one NMR signal by means of the NMR spectrometer.

5. The method of claim 4, wherein an initial value of a transmitting coil is selected for the transmission power, wherein an RF pulse with the initial value of the transmission power is irradiated, the NMR signal is recorded by the NMR spectrometer, the pulse angle of the RF pulse irradiated for generating the NMR signal is determined by means of the recorded NMR signal, and the transmission power of the RF pulse with desired pulse angle and desired pulse duration is determined by the determined pulse angle.

6. The method of claim 1, wherein a radio frequency H or E field generated by the RF coil is measured as the parameter.

7. The method of claim 6, wherein transmission powers and/or the phases of the RF signals are adjusted for a duration of a pulse sequence, wherein, during the pulse sequence, several measurements of the radio frequency H or E field generated by the RF coil are carried out.

8. The method of claim 6, wherein transmission powers and/or the phases of the RF signals are adjusted for a duration of one single pulse, wherein the radio frequency H or E field generated by the RF coil is measured in dependence on time.

9. A nuclear magnetic resonance probe head for performing the method of claim 6, wherein several RF coils are provided and with a measuring probe for measuring a current in and/or a voltage across the RF coils and/or for measuring an RF field generated by the RF coils, the probe being Inductively coupled to all RF coils.

10. An NMR system comprising the probe head of claim 9.

11. A method for regulating radio frequency (RF) signals in a nuclear magnetic resonance (NMR) system, the NMR system having a spectrometer, a control loop, and an NMR probe head with RF components, the method comprising the steps of:
    a) transmitting, using a transmitter disposed in the NMR spectrometer, RF signals at measuring frequencies and with a transmission power;
    b) tuning, using the RF components; an RF oscillating circuit disposed in the NMR probe head to a resonance frequency of a type of nucleus to be investigated;
    c) utilizing the RF oscillating circuit to excite nuclear spins in a sample and to receive NMR signals resulting from excitation of those nuclear spins, the RF oscillating circuit having at least one RF coil which is disposed around the sample to emit and receive RF signals;
    d) controlling, using the control loop, a duration, phase and/or power of the transmitted RF signals;
    e) measuring a parameter using the NMR probe head;
    f) determining, using the parameter measured in step e), a current in or a voltage across one of the RF components; and
    g) regulating transmission powers, phases and/or durations of the RF signals in dependence on the parameter measured in step e), wherein a Q-value of the RF oscillating circuit and/or an impedance adjustment of the RF oscillating circuit to a transmission line are measured as the parameter.

12. A method for regulating radio frequency (RF) signals in a nuclear magnetic resonance (NMR) system, the NMR system having a spectrometer, a control loop, and an NMR probe head with RF components, the method comprising the steps of:
    a) transmitting, using a transmitter disposed in the NMR spectrometer, RF signals at measuring frequencies and with a transmission power;
    b) tuning, using the RF components, an RF oscillating circuit disposed in the NMR probe head to a resonance frequency of a type of nucleus to be investigated;
    c) utilizing the RF oscillating circuit to excite nuclear spins in a sample and to receive NMR signals resulting from excitation of those nuclear spins, the RF oscillating circuit having at least one RF coil which Is disposed around the sample to emit and receive RF signals;
d) controlling; using the control loop, a duration, phase and/or power of the transmitted RF signals;
e) measuring a parameter using the NMR probe head;
f) determining, using the parameter measured in step e), a current in or a voltage across one of the RF components; and
g) regulating transmission powers, phases and/or durations of the RF signals in dependence on the parameter measured in step e), wherein a radio frequency H or E field generated by the RF coil is measured as the parameter, transmission powers and/or the phases of the RF signals being adjusted for a duration of a pulse sequence and, during the pulse sequence, several measurements of the radio frequency H or E field generated by the RF coil are carried out or transmission powers and/or the phases of the RF signals are adjusted for a duration of one single pulse, wherein the radio frequency H or E field generated by the RF coil is measured in dependence on time.

13. The method of claim 12, wherein regulation of the transmission power is performed for the duration of one pulse such that the RF pulse shape generated thereby coincides with a previously determined pulse shape.

14. A nuclear magnetic resonance probe head for performing the method of claim 12, wherein several RF coils are provided and with a measuring probe for measuring a current in and/or a voltage across the RF coils and/or for measuring an RF field generated by the RF coils, the probe being inductively coupled to all RF coils.

15. An NMR system comprising the probe head of claim 14.

* * * * *